(12) United States Patent
Tanaka (10) Patent No.: US 7,193,723 B2
(45) Date of Patent: Mar. 20, 2007

(54) POSITIONING APPARATUS AND PHOTOLITHOGRAPHY APPARATUS INCLUDING THE SAME

(75) Inventor: Hideo Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 136 days.

(21) Appl. No.: 11/157,781

(22) Filed: Jun. 21, 2005

(65) Prior Publication Data
US 2006/0001889 A1    Jan. 5, 2006

(30) Foreign Application Priority Data
Jul. 2, 2004    (JP)    ............. 2004-196455

(51) Int. Cl.
*G01B 11/02*    (2006.01)

(52) U.S. Cl. .................................... 356/500
(58) Field of Classification Search ........... 356/496, 356/498, 500; 355/53, 72
See application file for complete search history.

(56) References Cited

U.S. PATENT DOCUMENTS

| | | | | |
|---|---|---|---|---|
| 6,069,683 A | * | 5/2000 | Iwamoto | ............. 355/53 |
| 6,160,628 A | * | 12/2000 | Inoue | ............. 356/500 |
| 6,285,457 B2 | * | 9/2001 | Ukaji | ............. 356/500 |
| 6,414,742 B1 | | 7/2002 | Korenaga et al. | |
| 6,664,619 B2 | | 12/2003 | Mitani et al. | |
| 6,819,433 B2 | | 11/2004 | Takai et al. | |
| 2005/0111005 A1 | * | 5/2005 | Eussen et al. | ............. 356/498 |

FOREIGN PATENT DOCUMENTS

| | | |
|---|---|---|
| JP | 11-190786 A | 7/1999 |
| JP | 2001-143997 A | 5/2001 |
| JP | 2003-123832 A | 4/2003 |
| KR | 2002-0067658 | 8/2002 |

* cited by examiner

*Primary Examiner*—Gregory J. Toatley, Jr.
*Assistant Examiner*—Michael A. Lyons
(74) *Attorney, Agent, or Firm*—Canon U.S.A. Inc I.P. Div (57) ABSTRACT

A positioning apparatus includes first and second stages, a pair of first mirrors having reflective surfaces disposed on the first stage at an acute angle with a vertical axis, a pair of second mirrors disposed on the second stage and having reflective surfaces orthogonal to the vertical axis, a reference structure functioning as a reference for measuring the vertical position of the second stage, a pair of third mirrors disposed on the reference structure and having reflective surfaces orthogonal to the vertical axis, and a pair of interferometers for measuring the vertical position of the second stage using the first, second, and third mirrors.

14 Claims, 6 Drawing Sheets

POSITIONING APPARATUS AND PHOTOLITHOGRAPHY APPARATUS INCLUDING THE SAME

BACKGROUND OF THE INVENTION

1. Field of the Invention

The present invention relates to a positioning apparatus and, more specifically, relates to a positioning apparatus included in a photolithography apparatus used for producing devices such as semiconductors and liquid crystal devices.

2. Description of the Related Art

When using a photolithography apparatus for producing a device such as a semiconductor or a liquid crystal device, the substrate must be positioned highly accurately. A positioning mechanism for the photolithography apparatus may include a coarse movement stage movable in a large area and a fine movement stage movable in a smaller area as compared to the coarse movement stage.

Japanese Patent Laid-Open No. 2001-143997 discloses a method for measuring the displacement of a fine movement stage, on which a wafer is disposed, in the Z direction (vertical direction) for a photolithography apparatus. This method will be briefly described with reference to FIG. 6.

Figure 6:
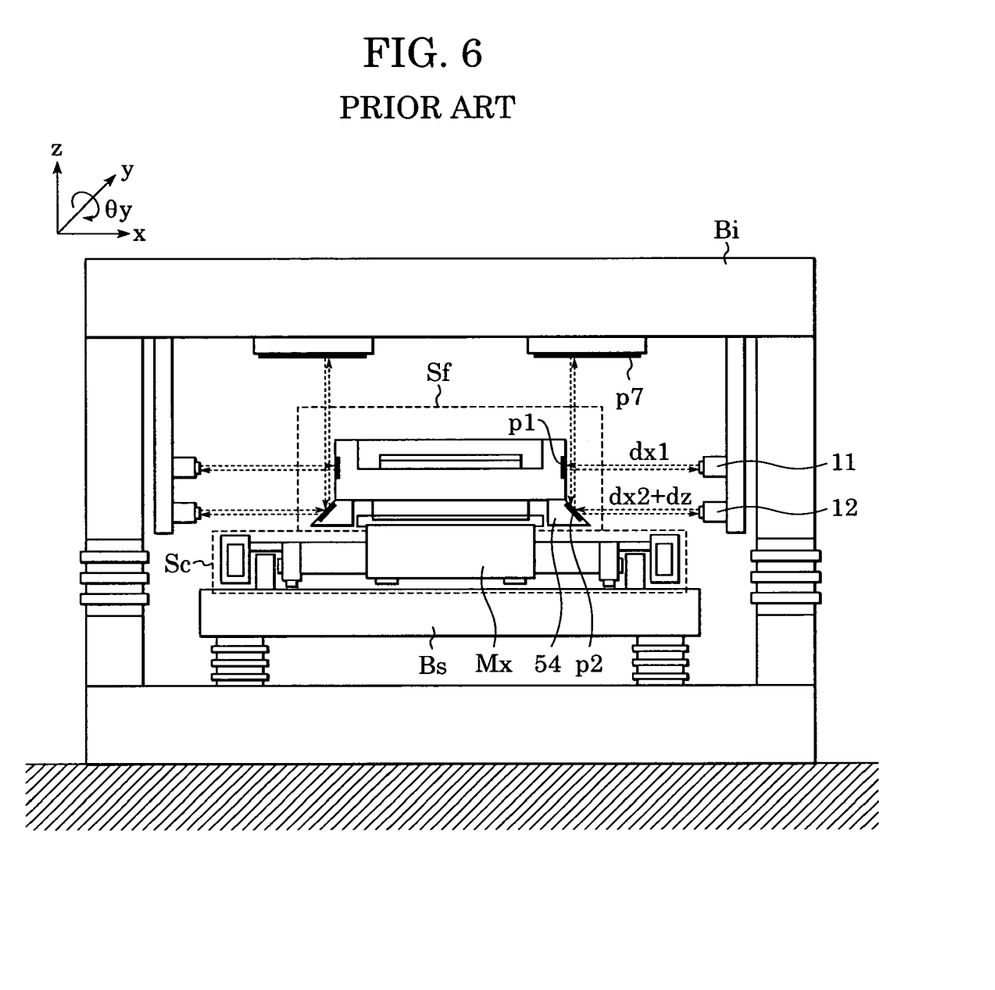
FIG. 6 is a schematic drawing illustrating a known positioning apparatus.

The positioning apparatus illustrated in FIG. 6 includes a coarse movement stage Sc and a fine movement stage Sf. An X-direction moving element Mx of the coarse movement stage Sc is movable in the X and Y directions relative to a stage base Bs. The fine movement stage Sf is disposed on the X-direction moving element Mx and is movable in a smaller area relative to the X-direction moving element Mx.

An instrument base Bi is provided for mounting components on the measurement reference side of the positioning apparatus. The instrument base Bi includes an X interferometer 11 for measuring the position of the fine movement stage Sf in the X direction and a Z interferometer 12 for measuring the position of the fine movement stage Sf in the Z direction.

A mirror surface p1 for measuring the position in the X direction and a bar mirror 54 and a mirror surface p2 for measuring the position in the Z direction are disposed on the fine movement stage Sf. A mirror surface p7 for measuring the position in the Z direction is disposed on the instrument base Bi.

A measurement light beam emitted from the Z interferometer 12 is reflected at the mirror surfaces p2 and p7 and is returned to the Z interferometer 12. The measurement light beam is interfered with a reference light beam (not shown in the drawing) to measure a displacement dx+dz. A measurement light beam emitted from the X interferometer 11 is reflected at the mirror surface p1 and returned to the X interferometer 11. The measurement light beam is interfered with a reference light beam (not shown in the drawing) to measure a displacement dx. The displacement in the Z direction is measured by obtaining the difference between the displacement dx+dz and the displacement dx.

In the above-described structure, the reference light beam is guided for a predetermined distance. Therefore, if there is a temperature difference between the light paths of the measurement light beam and the reference light beam, an error occurs in the measured value. In particular, when determining the displacement in the Z direction using the X and Z interferometers 11 and 12, the X and Z interferometers 11 and 12 are both affected by the temperature fluctuation in the environment, causing a twofold error to decrease the measurement accuracy. In addition to the error due to the temperature difference of the light paths, errors due to other reasons will also be twofold. Furthermore, depending on the position of the stage, the distances between the X and Z interferometers 11 and 12 and the mirror surfaces p1 and p1 greatly change. As a result, the measurement accuracy is significantly reduced.

It is undesirable to dispose a mirror having a reflective surface at an acute angle relative to the vertical direction, such as the bar mirror 54, as illustrated in FIG. 6, on the fine movement stage Sf because it will have negative effects on the weight and rigidity of the fine movement stage Sf and will cause a degradation in the control of the fine movement stage Sf.

SUMMARY OF THE INVENTION

The present invention is directed to a positioning apparatus. In one aspect of the present invention, a positioning apparatus includes a first stage, a second stage movable relative to the first stage, a pair of first mirrors having reflective surfaces disposed on the first stage at an acute angle with a vertical axis, a pair of second mirrors disposed on the second stage and having reflective surfaces orthogonal to the vertical axis, a reference structure facilitating measuring the vertical position of the second stage, a pair of third mirrors disposed on the reference structure and having reflective surfaces orthogonal to the vertical axis, and a pair of interferometers for measuring the vertical position of the second stage using the first, second, and third mirrors.

The positioning apparatus according to the present invention is capable of reducing errors in the measurement of the vertical direction. As a result, a second stage of the positioning apparatus can be positioned highly accurately.

Further features and advantages of the present invention will become apparent from the following description of exemplary embodiments (with reference to the attached drawings).

DESCRIPTION OF THE EMBODIMENTS

First Embodiment

A positioning apparatus according to a first embodiment of the present invention will now be described. In this embodiment, a photolithography apparatus including the positioning apparatus is described. The photolithography apparatus is used for manufacturing semiconductor devices, such as semiconductor integrated circuits, and devices having fine patterns, such as micromachines and thin film magnetic heads. By emitting an exposure light beam as exposure energy from a lighting system 50 to a wafer, which is a substrate, via a reticle 40, which is the original plate, and via a projection lens, which is a projection lens system 20, a predetermined pattern is formed on the wafer disposed on the positioning apparatus. Here, the term "exposure light beam" is a generic term referring to one of a visible light beam, an ultraviolet light beam, an extreme ultraviolet (EUV) light beam, an X-ray beam, an electron beam, and a charged particle beam. The term "projection lens" is a generic term referring to one of a refractive lens, a reflective lens, a catadioptric lens, and a charged particle lens. The pattern may be transferred using a step-and-repeat method or a step-and-scan method.

Figure 1A:
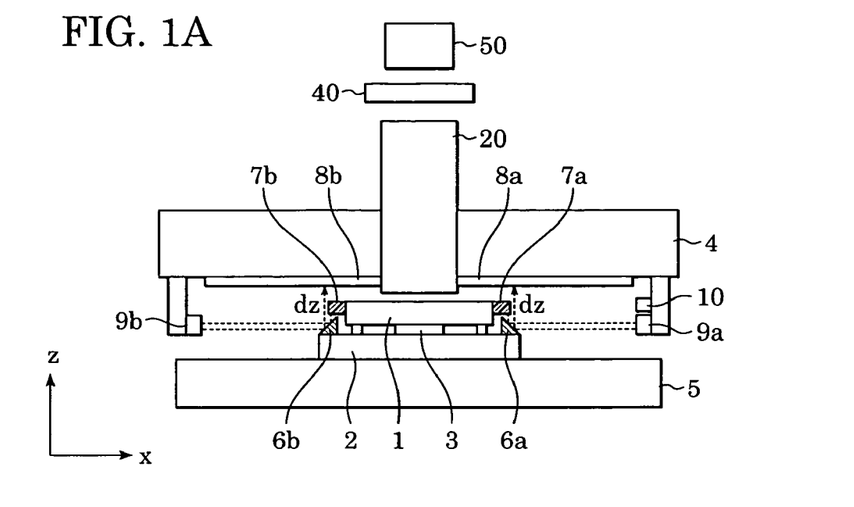
FIGS. 1A–C are schematic drawings illustrating a positioning apparatus according to a first embodiment of the present invention.

As illustrated in FIG. 1A, the positioning apparatus includes a coarse movement stage 2, that moves in a large area relative to a base 5, and a fine movement stage 1 that is disposed on the coarse movement stage 2 and moves in a small area relative to the coarse movement stage 2. A wafer is disposed on the fine movement stage 1 and is highly accurately positioned relative to the pattern.

The coarse movement stage 2 is supported movably in the X and Y directions relative to the base 5. As a support mechanism, air bearings may be used to float the coarse movement stage 2 or a magnetic force, such as magnetic attraction or a Lorentz force, may be utilized to float the coarse movement stage 2. The coarse movement stage 2 is floated to improve accuracy. According to this embodiment, a surface motor is used as a driving mechanism. In general, the surface motor generates a driving force by applying an electric current to a coil connected to a moving element (movement stage 2) or a fixed element (base 5). The method for generating a driving force may be a system based on variable magnetic resistance (surface pulse motor) or a system based on Lorentz force. Since the mechanisms of these system are disclosed in Japanese Patent Laid-Open Nos. 11-190786 (corresponding to U.S. Pat. No. 6,414,742) and 2003-123832 (corresponding to U.S. Pat. No. 6,664,619), detailed descriptions are omitted in this document.

The fine movement stage 1 moves in large strokes together with the coarse movement stage 2 in the X and Y directions by, for example, electromagnetic coupling. An actuator 3 is interposed between the coarse movement stage 2 and the fine movement stage 1. The actuator 3 moves the fine movement stage 1 in a small area relative to the coarse movement stage 2. The actuator 3 may be a linear motor, an electromagnet, an air actuator, or a piezoelectric element. Better accuracy can be achieved by using a non-contact actuator.

The fine movement stage 1 may be driven in six directions: along the X axis, along the Y axis, along the Z axis (vertical axis), in the ωx direction (around the X axis), in the ωy direction (around the Y axis), and in the ωx direction (around the X axis). However, the number of driving directions is not limited to six directions.

A supporting member 4 is a reference structure that functions as a reference for measuring the position of the fine movement stage 1. The supporting member 4 according to this embodiment supports the projection optical system 20. In other words, if a structure other than the supporting member is used as a reference for measuring the position of the fine movement stage 1, the structure will be equivalent to the supporting member 4 according to this embodiment.

Figure 1B:
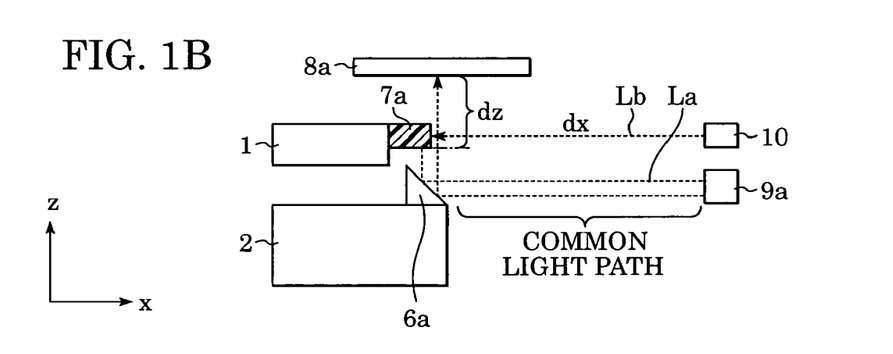

Next, the position measurement by the positioning apparatus according to this embodiment will be described with reference to FIG. 1B. FIG. 1B is an exploded view of FIG. 1A. An X interferometer 10 for measuring the position of the fine movement stage 1 in the X direction, a Y interferometer (not shown in the drawing), and Z interferometers 9a and 9b for measuring the position of the fine movement stage 1 in the Z direction are disposed on the supporting member 4.

Mirrors 6a and 6b are disposed on the coarse movement stage 2. The reflective surfaces of the mirrors 6a and 6b form an acute angle (about 45° according to this embodiment) with the Z axis. Any type of component may be used as the mirrors 6a and 6b so long as the component is capable of reflecting measurement light beams and reference light beams emitted from the Z interferometers 9a and 9b in the Z direction. The mirrors 6a and 6b may be provided separately from the coarse movement stage 2 or may be provided as a unit with the coarse movement stage 2.

Mirrors 7a and 7b having XY planes (reflective surfaces orthogonal to the vertical direction) are disposed on the fine movement stage 1. Any type of component may be used as the mirrors 7a and 7b so long as the component is capable of reflecting the measurement light beam and the reference light beam reflected at the mirrors 6a and 6b.

Similarly, mirrors 8a and 8b having XY planes (reflective surfaces orthogonal to the vertical direction) are disposed on the supporting member 4. Any type of component may be used as the mirrors 8a and 8b so long as the component is capable of reflecting the measurement light beam and the reference light beam reflected at the mirrors 7a and 7b.

The Z interferometer 9a (9b) measures displacement by emitting a reference light beam La and a measurement light beam Lb and measuring the interference of the two light beams when reflected back. The dotted lines in FIG. 1B indicate light paths of the reference light beam La and the measurement light beam Lb. The reference light beam La and the measurement light beam Lb emitted from the Z interferometer 9a (9b) are bent in the Z direction at the mirror 6a (6b). By emitting the reference light beam La and the measurement light beam Lb at different positions on the reflective surface of the mirror 6a (6b), the reference light beam La is reflected to the mirror 7a (7b) and the measurement light beam Lb is reflected to the mirror 8a (8b). The reference light beam La and the measurement light beam Lb emitted to the mirrors 7a (7b) and 8a (8b), respectively, in the +Z direction is reflected back in the −Z direction. The reflected light beams La and Lb are bent again at the mirror 6a (6b) and returned to the Z interferometer 9a (9b). The interference between the reference light beam La and the measurement light beam Lb enables the Z interferometer 9a (9b) to measure the displacement dz of the fine movement stage 1 and the supporting member 4 in the Z direction.

The horizontal (X direction in the drawing) portion dx of the light paths of the reference light beam La and the measurement light beam Lb, pass through substantially the same space, and therefore, the effect of the air fluctuation is cancelled out. Accordingly, errors in the measurement are reduced.

Here, the reference light beam La may be used as a measurement light beam, and the measurement light beam Lb may be used as a reference light beam, so long as the difference between the two light beams are determined by interfering the two light beams.

The measurement light beam Lb from the X interferometer 10 is reflected at the side surface (YZ plane) of the mirror 7a (7b) and enters the X interferometer 10 again. The X interferometer 10 measures the position of the fine movement stage 1 in the X direction from the difference between the measurement light beam Lb and a reference light beam not shown in the drawing. The mirrors for measuring the position of the fine movement stage 1 in the X and Z directions are provided separately in this embodiment. Alternatively, the same mirrors may be used for measuring the position of the fine movement stage 1 in each direction.

For measuring the position of the fine movement stage 1 in the Y direction, a mirror having an XZ plane is disposed on the fine movement stage 1. A measurement light beam is emitted from the Y interferometer (not shown in the drawing) is reflected at the mirror and a measurement can be made in the same manner as the measurement in the X direction.

By disposing a plurality of X and Y interferometers, the rotational directions ($\omega$x, $\omega$y, $\omega$y directions) of the fine movement stage 1 can be measured.

Figure 1C:
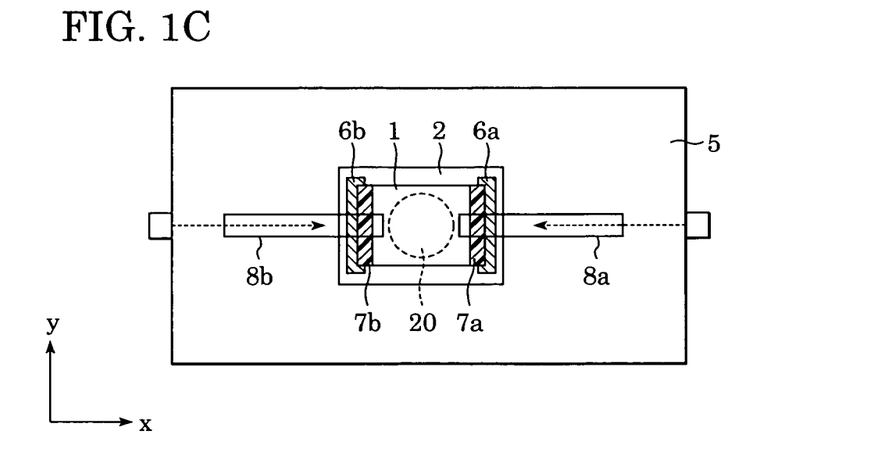

FIG. 1C illustrates the positioning apparatus according to this embodiment viewed from the +Z direction. As illustrated in the drawing, the mirrors 6a and 6b and mirrors 7a and 7b are disposed along the Y axis. In this way, the Z interferometers 9a and 9b do not have to be moved to measure the position in the Z direction even when the fine movement stage 1 is moved.

The mirrors 6a and 6b are disposed at opposite sides of the coarse movement stage 2, and the mirrors 7a and 7b are disposed at opposite sides of the fine movement stage 1. In this way, even when the projection optical system 20 is disposed above the mirror on one side (for example, mirrors 6a and 7a), the mirrors on the other side (for example, mirrors 6b and 7b) can be used to measure the position of the fine movement stage 1 in the Z direction. In other words, even when the coarse movement stage 2 is moved within a large area, at least one of the Z interferometers 9a and 9b will be able to measure the position of the fine movement stage 1 in the Z direction. Accordingly, the position of the fine movement stage 1 in the Z direction can always be measured.

According to the above-described structure, the reflective surfaces of the mirrors 8a and 8b do not have to be disposed on the entire lower surface of the supporting member 4. The mirrors 8a and 8b are disposed orthogonal to the mirrors 6a and 6b and the mirrors 7a and 7b. The mirrors 8a and 8b are disposed on both sides of the projection optical system 20 along a straight line passing through the projection optical system 20. In this way, the size of the mirrors, which are components that require accuracy, can be reduced to improve accuracy and reduce production cost of the positioning apparatus.

The measurement light beam Lb from the Z interferometer 9a (9b) is guided in the X direction such that the measurement light beam Lb is emitted at the mirror 6a (6b) below the mirror 8a (8b).

The mirror 6a (6b) and the mirror 7a (7b) may be disposed along the X axis and the mirror 8a (8b) may be disposed along the Y axis so that the Z interferometer 9a (9b) emits light beams along the Y axis to the mirror 6a (6b).

Variation of the First Embodiment

In the description above, the coarse movement stage 2 is driven by a surface motor. However, the driving force is not limited to a surface motor and various driving mechanisms may by used to drive the coarse movement stage 2.

Figure 2A:
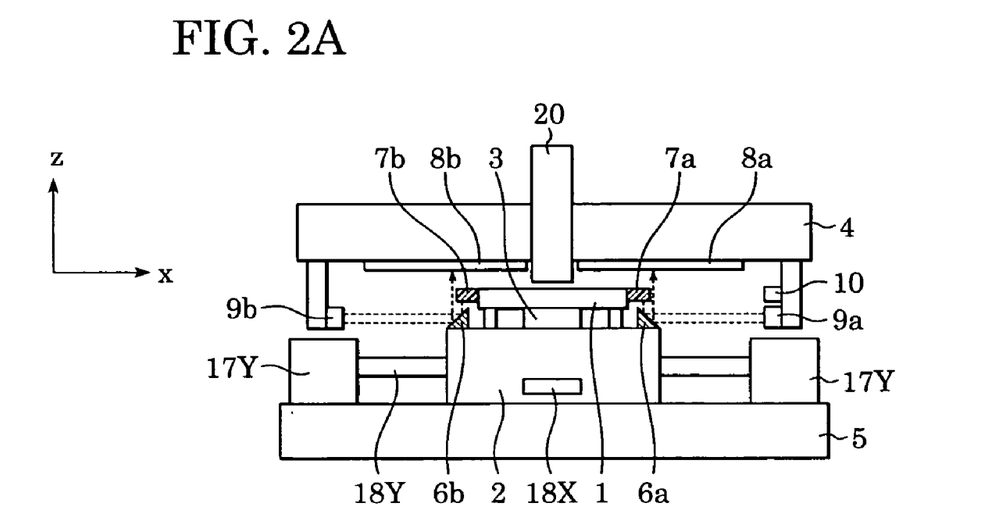
FIGS. 2A and 2B are schematic drawings illustrating a positioning apparatus according to a variation of the first embodiment of the present invention.
Figure 2B:
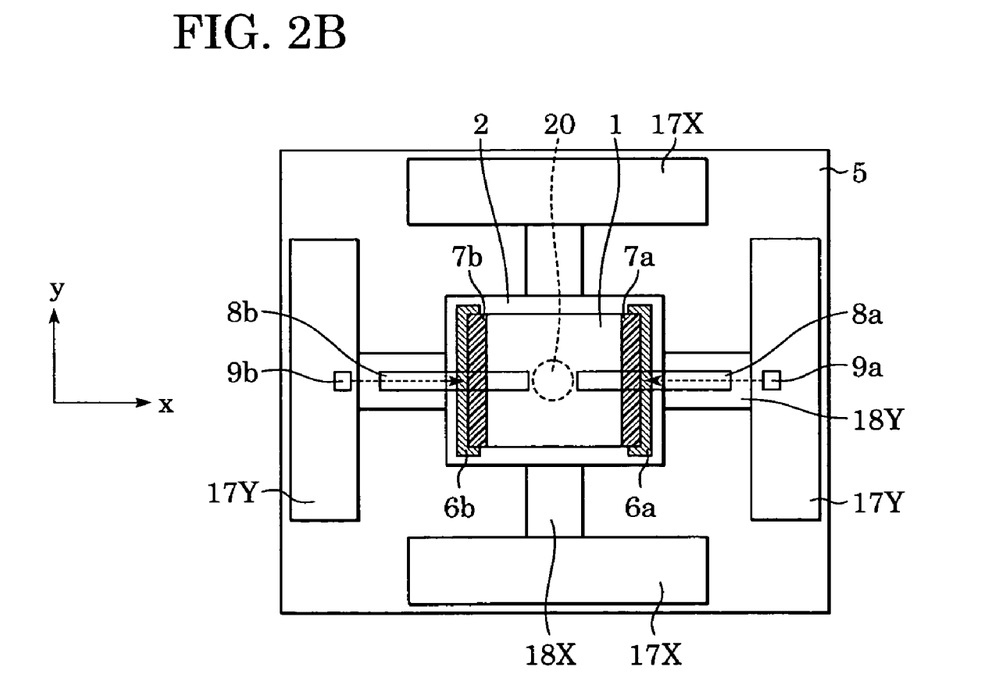

According to a variation of the first embodiment, as illustrated in FIG. 2, the coarse movement stage 2 is driven by a linear motor. Linear motor fixing parts 17X and 17Y are disposed on the base 5. A linear motor moving part 18X moves in the X direction relative to the linear motor fixing part 17X, and a linear motor moving part 18Y moves in the Y direction relative to the linear motor fixing part 17Y. The linear motor moving parts 18X and 18Y penetrate the coarse movement stage 2. As the linear motor moving parts 18X and 18Y move, the coarse movement stage 2 moves in the X and Y direction within a large area.

The positioning apparatus according to this embodiment is used for a photolithography apparatus. However, the positioning apparatus may be used for other apparatuses as well.

Second Embodiment

A positioning apparatus according to a second embodiment of the present invention will now be described with reference to FIG. 3. A case in which the positioning apparatus according to this embodiment is used for a photolithography apparatus will be described. Components having the same functions as the components according to the first embodiment are indicated by the same reference numerals in the drawings and their detailed descriptions are omitted.

The second embodiment differs from the first embodiment in that two of each coarse movement stages 21 and 22 and fine movement stages 11 and 12 (hereinafter, the pair of the coarse movement stages 21 (22) and the fine movement stages 11 (12) is referred to as "a coarse and fine movement stage") are provided. Such a positioning apparatus has been attracting attention recently for use in photolithography apparatuses. While a wafer disposed on one of the coarse and fine movement stages is being exposed, another wafer disposed on the other coarse and fine movement stage can be aligned. Therefore, throughput is improved. Here, the alignment includes aligning each chip of the wafers in the X and Y directions and also aligning the Z direction of the chips.

Figure 3A:
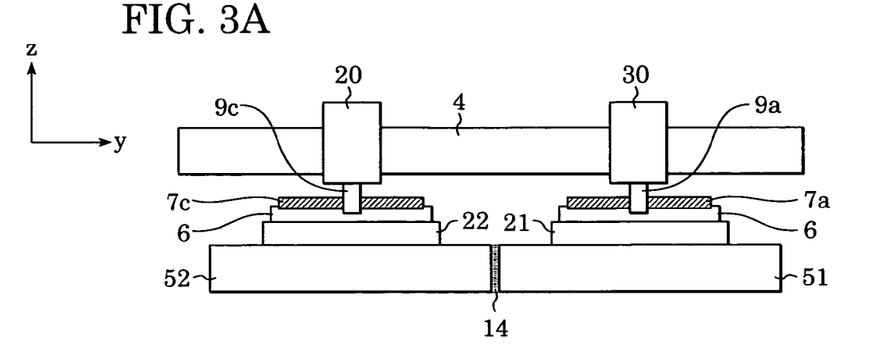
FIGS. 3A–C are schematic drawings illustrating a positioning apparatus according to a second embodiment of the present invention.
Figure 3B:
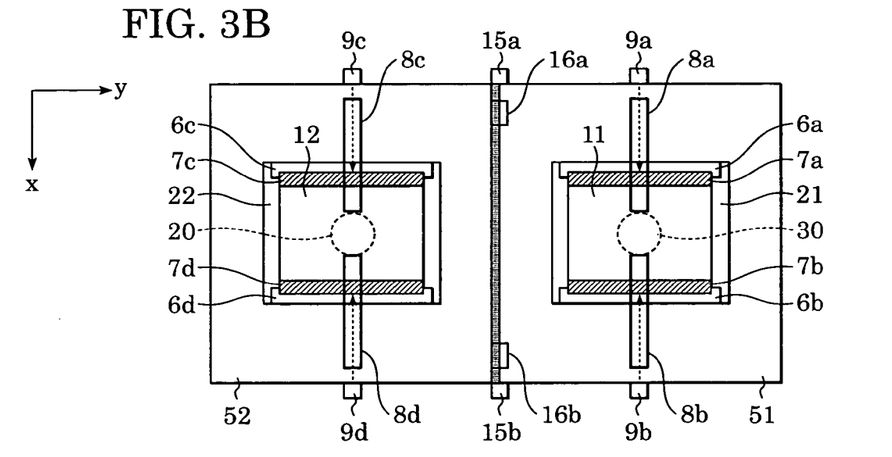
Figure 3C:
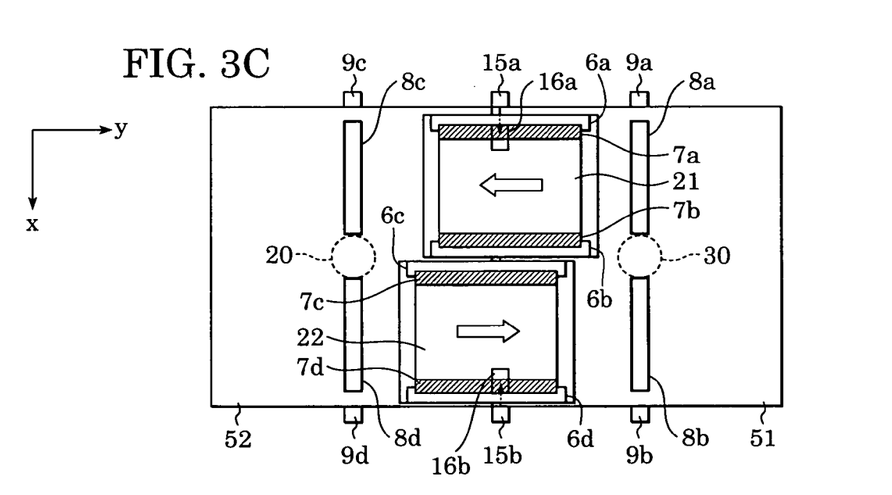

In FIGS. 3A–C, a projection optical system 20 and an alignment optical system 30 are supported by a supporting member 4. The base guiding the coarse movement stages 21 and 22 is divided into an exposure area 52 and a measurement area 51. The exposure area 52 is an area below the projection optical system 20 in which the coarse and fine movement stages are moved on the base when exposing the wafer disposed on the fine movement stage 11 and 12. The measurement area 51 is the area below the alignment optical system 30 in which the coarse and fine movement stages are moved on the base when aligning the wafers disposed on the fine movement stages 11 and 12.

Mirrors 6a and 6b are disposed on the coarse movement stage 21, and mirrors 6c and 6d are disposed on the coarse movement stage 22. Mirrors 7a and 7b are disposed on the fine movement stage 11, and mirrors 7c and 7d are disposed on the fine movement stage 12. Mirrors 8a to 8d are disposed in a direction orthogonal to a straight line connecting the projection optical system 20 and the alignment optical system 30. In other words, the mirrors 8a to 8d are disposed along the X direction in the drawing. The mirrors 8a and 8b are disposed along the straight line passing through the projection optical system 20, and the mirror 8c and 8d are disposed along the straight line passing through the alignment optical system 30.

By disposing the mirrors 8a to 8d in a direction orthogonal to a straight line connecting the projection optical system 20 and the alignment optical system 30, the measurement light beams and the reference light beams used to measure the position in the Z direction during exposure or measurement will not be blocked by the coarse and fine movement stages.

The functions of the mirrors 6a to 6d, 7a to 7d, and 8a to 8d are the same as the mirrors according to the first embodiment. Therefore, descriptions are omitted.

The transposition of the two coarse and fine movement stages between the exposure area 52 and the measurement area 51 is described with reference to FIG. 3C. After completing the exposure of a wafer disposed on the coarse and fine movement stage (11 and 21) in the exposure area 52, the coarse and fine movement stage (11 and 21) moves to a delivery position, not shown in the drawing, to send out the exposed wafer and receive a new wafer. Then the coarse and fine movement stage (11 and 21) moves to the measurement area 51 for alignment. The other coarse and fine movement stage (12 and 22) moves to the exposure area 52 to expose the wafer that has been aligned. These movements are repeated to align and expose a plurality of wafers.

Mirrors 16a and 16b having XY planes (reflective planes disposed orthogonally to the vertical direction) are disposed on the supporting member 4. The mirrors 16a and 16b are interposed between the exposure area 52 and the measurement area 51. Z interferometers 15a and 15b are disposed so that they emit measurement light beams and reference light beams in both directions along the X axis below the mirrors 16a and 16b.

The measurement light beam and the reference light beam emitted from the Z interferometer 15a (15b) are bent in the Z direction by the mirror 6a (6d) when the two coarse and fine stages are transposed, as illustrated in FIG. 3C. By emitting the measurement light beam and reference light beam on different positions on the reflective surface of the mirror 6a (6d), the reference light beam is projected onto the mirror 7a (7d) and the measurement light beam is projected onto the mirror 16a (16b). The measurement light beam and the reference light beam emitted in the +Z direction by the mirror 7a (7d) and the mirror 16a (16d) are reflected in the −Z direction, are bent at the mirror 6a (6d) again, and enter the Z interferometer 15a (15b). The displacement in the Z direction between the fine movement stage 11 (21) and the supporting member 4 is measured by making the reference light beam and the measurement light beam interfere with each other.

The horizontal (X direction in the drawing) portion dx of the light paths of the reference light beam La and the measurement light beam Lb, pass through substantially the same space, and therefore, the effect of the air fluctuation is cancelled out. Accordingly, errors in the measurement are reduced.

By making the length of each of the mirrors 6a to 6d and the mirrors 7a and 7d in the Y direction longer than the distance between the mirror 6a or 6c (6b or 6d) and the Z interferometer 9a or 9c (9b or 9d) and the distance between the mirror 6a or 6c (6b or 6d) and the Z interferometer 15a (15b) in the Y direction, the positions of the fine movement stages 11 and 12 in the Z direction can be measured continuously.

As described above, by disposing the mirrors 16a and 16b orthogonally to the line where the two coarse and fine stages pass each other when being transposed, i.e., orthogonally to the border of the exposure area 52 and the measurement area 51, the position in the Z direction can be continuously measured even when the two coarse and fine stages are transposed.

Since the base according to this embodiment is divided into the exposure area 52 and the measurement area 51, the effects of the heat and oscillation in each area can be blocked and interference between the two areas can be reduced. When using a base having such a two-area structure, it is important to compensate for the Z direction of the stages when they are transposed. Therefore, a positioning apparatus such as the positioning apparatus according to this embodiment can be used.

The positioning apparatuses according to the first and the second embodiments may be used as a wafer stage of a photolithography apparatus to provide a photolithography apparatus having high accuracy and high throughput. A method for producing a device using such a photolithography apparatus will be described below.

Method for Producing a Device Using Photolithography Apparatus

Figure 4:
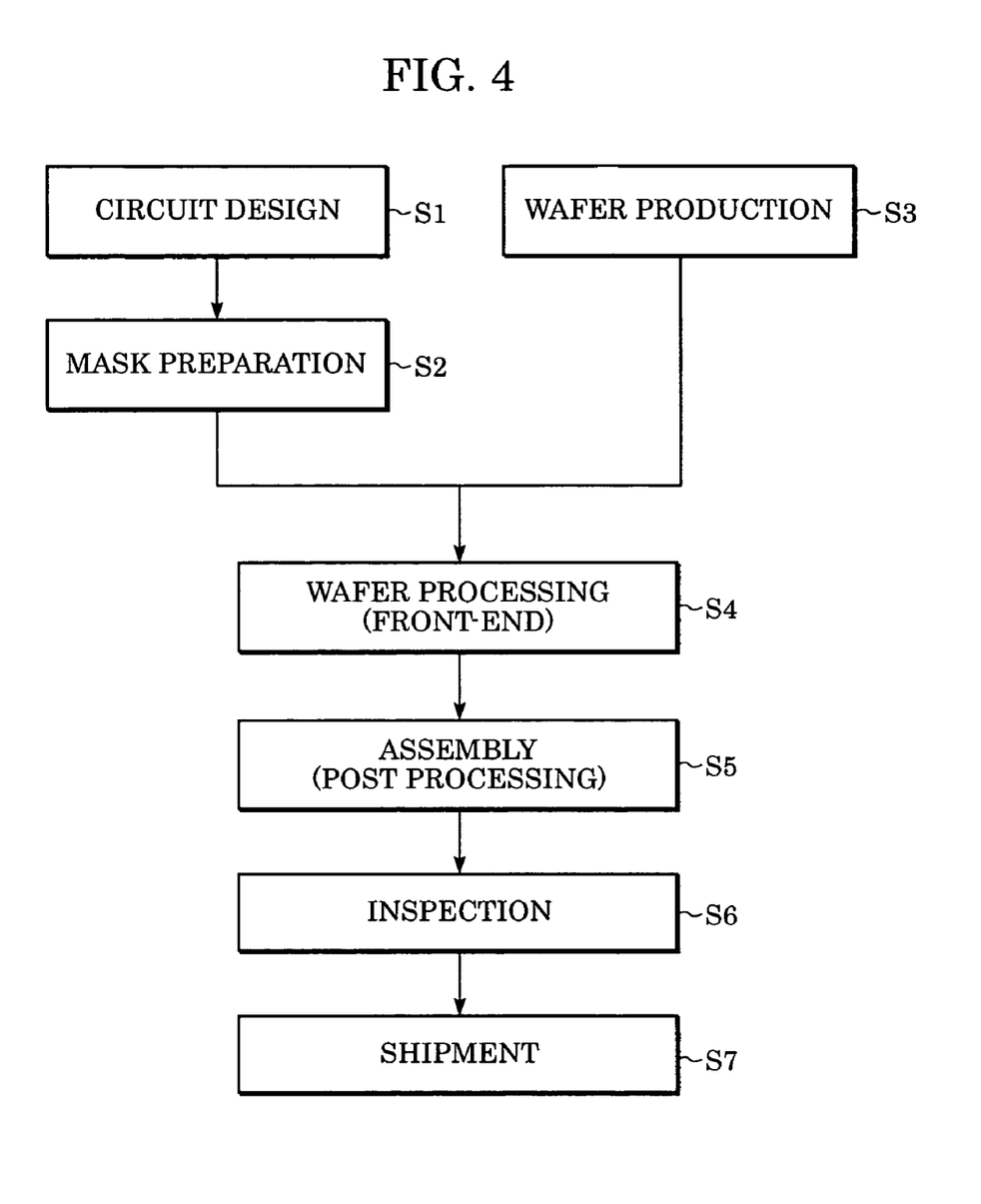
FIG. 4 is a schematic drawing illustrating a process for producing a device.

Next, the process for producing a semiconductor device using the above-mentioned photolithography apparatus will be described. FIG. 4 is a flow chart illustrating the overall process for producing a semiconductor device. In Step S1 (circuit design), the circuit of the semiconductor device is designed. In Step S2 (mask preparation), a mask is prepared based on the designed circuit pattern.

In Step S3 (wafer production), a wafer is produced using a material such as silicon. Step S4 (wafer processing) is the front-end of wafer processing. In Step S4, the circuit is formed on the wafer with the mask using the photolithography apparatus. The subsequent Step S5 is the post-processing of wafer processing. In Step S5, the produced wafer is prepared into semiconductor chips. The post-processing in Step S5 includes steps such as, an assembling step (dicing and bonding) and a packaging step (chip packaging). In Step S6 (inspection), inspections, such as an operation check and a durability test, are carried out on the semiconductor device produced in Step S5. Through such steps, the production of a semiconductor device is completed, and then in Step S7, the semiconductor device is shipped.

Figure 5:
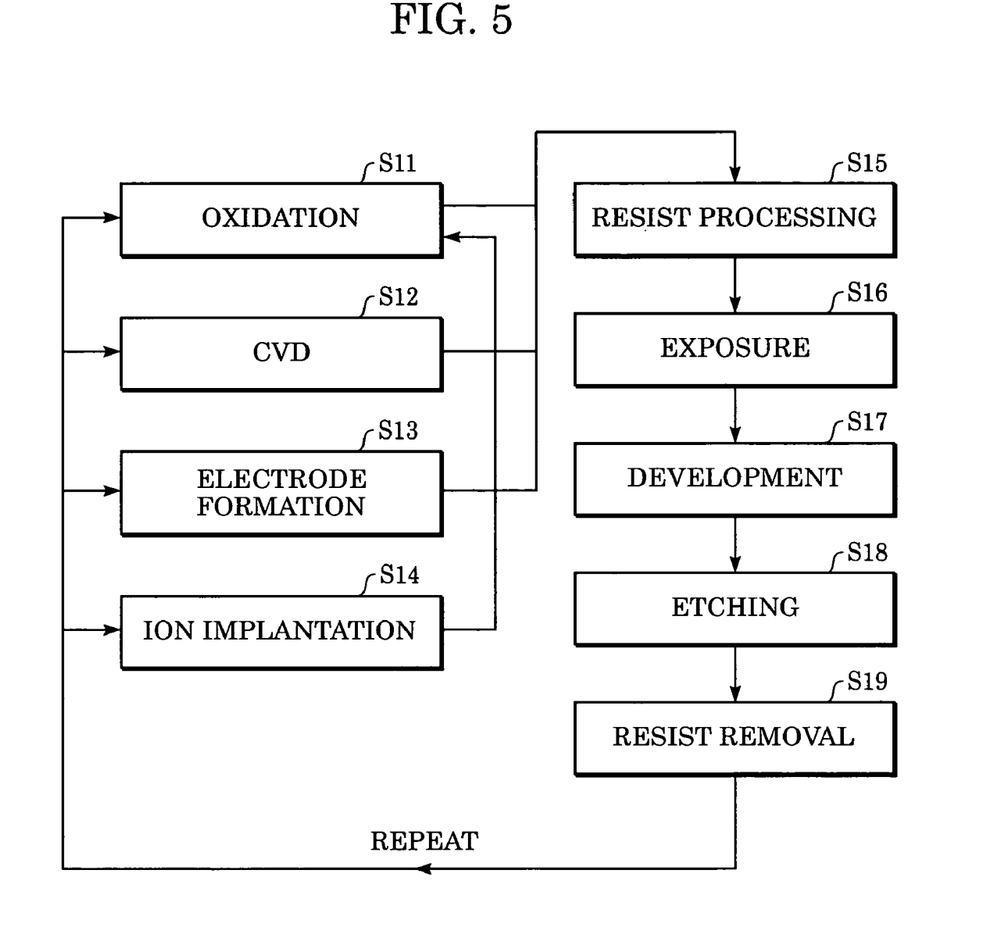
FIG. 5 is a schematic drawing illustrating a process for producing a wafer.

The wafer processing in Step S4 includes the following steps (refer to FIG. 5): an oxidation step for oxidizing the surface of the wafer, a chemical vapor deposition (CVD) step for forming an insulation film on the surface of the wafer, an electrode formation step for forming electrodes on the wafer by deposition, an ion implantation step for implanting ions into the wafer, a resist processing step for applying a photosensitizer on the wafer, an exposure step for transferring the circuit pattern onto the wafer after being processed in the resist processing step by the above-mentioned photolithography apparatus, a developing step for developing the wafer exposed in the exposure step, an etching step for removing parts other than the resist image developed in the developing step, and a resist removal step for removing the unwanted resist that has been etched. By repeating these steps, multiple circuit patterns can be formed on the wafer.

By producing a device using the photolithography apparatus including the positioning apparatus according to the first or second embodiments as a wafer stage, fine devices can be produced at low cost.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-196455 filed Jul. 2, 2004, which is hereby incorporated by reference herein.

What is claimed is:

1. A positioning apparatus comprising:

a first stage;

a second stage movable relative to the first stage;

a pair of first mirrors disposed on the first stage, the first mirrors having reflective surfaces positioned at an acute angle with respect to a vertical axis;

a pair of second mirrors disposed on the second stage, the second mirrors having reflective surfaces positioned orthogonal to the vertical axis;

a reference structure facilitating measuring a vertical position of the second stage;

a pair of third mirrors disposed on the reference structure, the third mirrors having reflective surfaces positioned orthogonal to the vertical axis; and a pair of interferometers configured to measure the vertical position of the second stage using the first, second, and third mirrors.

2. The positioning apparatus according to claim 1, wherein the first and second mirrors are disposed along a first direction orthogonal to a direction in which a measurement light beam is emitted at the first mirrors from the interferometers.

3. The positioning apparatus according to claim 2, wherein the third mirrors are disposed along a second direction orthogonal to the first direction.

4. The positioning apparatus according to claim 3, wherein the first mirrors are disposed on opposite sides of the first stage and the second mirrors are disposed on opposite sides of the second stage.

5. A photolithography apparatus for processing a substrate, comprising:
a light source; and
the positioning apparatus according to claim 1, the positioning apparatus positioning the substrate relative to the light source in order to transfer a pattern on the substrate.

6. A photolithography apparatus for processing a substrate, comprising:
a light source; and
the positioning apparatus according to claim 2, the positioning apparatus positioning the substrate relative to the light source in order to transfer a pattern on the substrate.

7. A photolithography apparatus for processing a substrate, comprising:
a light source; and
the positioning apparatus according to claim 3, the positioning apparatus positioning the substrate relative to the light source in order to transfer a pattern on the substrate.

8. A photolithography apparatus for processing a substrate, comprising:
a light source; and
the positioning apparatus according to claims 4, the positioning apparatus positioning the substrate relative to the light source in order to transfer a pattern on the substrate.

9. A photolithography apparatus for processing substrates, comprising:
at least two of the positioning apparatuses according to claim 1;
a projection optical system configured to expose a first substrate disposed on the second stage of one of the two positioning apparatuses; and an alignment optical system aligning a second substrate disposed on the second stage of the other one of the two positioning apparatuses while the first substrate is being exposed by the projection optical system, wherein the third mirrors are disposed along a direction orthogonal to a line connecting the projection optical system and the alignment optical system.

10. The photolithography apparatus according to claim 9, wherein the two positioning apparatuses are transposable between a position below the projection optical system and a position below the alignment optical system, and wherein a pair of fourth mirrors having a reflective surface orthogonal to the vertical axis is disposed on the reference structure along a line where the two positioning apparatuses pass each other when being transposed.

11. The photolithography apparatus according to claim 10, further comprising a base guiding the first stage, the base defining an area below the projection optical system and an area below the alignment optical system.

12. A photolithography apparatus comprising:
a projection optical system;
a supporting member supporting the projection optical system;
a fine movement stage carrying a substrate;
a coarse movement stage carrying the fine movement stage;
an interferometer emitting first and second measurement light beams in order to measure a position of the fine movement stage;
a first reflective unit reflecting the first and second measurement light beams in a vertical direction, the first reflective unit being disposed on the coarse movement stage;
a second reflective unit reflecting the first measurement light beam reflected at the first reflecting unit, the second reflective unit being disposed on the fine movement stage; and
a third reflective unit reflecting the second measurement light beam reflected at the first reflective unit, the third reflective unit being disposed on the supporting member.

13. A method for producing a device comprising the following steps:
processing a wafer using the photolithography apparatus according to claim 5; and
assembling the wafer processed in the processing step into the device.

14. A method for producing a device comprising the following steps:
processing a wafer using the photolithography apparatus according to claim 12; and
assembling the wafer processed in the processing step into the device.

* * * * *